United States Patent
Van Haren et al.

(10) Patent No.: US 11,619,884 B2
(45) Date of Patent: Apr. 4, 2023

(54) METHOD FOR ADJUSTING A TARGET FEATURE IN A MODEL OF A PATTERNING PROCESS BASED ON LOCAL ELECTRIC FIELDS

(71) Applicant: ASML NETHERLANDS B.V., Veldhoven (NL)

(72) Inventors: Richard Johannes Franciscus Van Haren, Waalre (NL); Leon Paul Van Dijk, Eindhoven (NL); Oktay Yildirim, Eindhoven (NL); Orion Jonathan Pierre Mouraille, Eersel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/298,640

(22) PCT Filed: Nov. 12, 2019

(86) PCT No.: PCT/EP2019/080996
§ 371 (c)(1),
(2) Date: May 31, 2021

(87) PCT Pub. No.: WO2020/114729
PCT Pub. Date: Jun. 11, 2020

(65) Prior Publication Data
US 2022/0050387 A1    Feb. 17, 2022

(30) Foreign Application Priority Data
Dec. 7, 2018    (EP) ..................... 18211056

(51) Int. Cl.
*G03F 7/20*    (2006.01)
*G03F 1/70*    (2012.01)

(52) U.S. Cl.
CPC ............ *G03F 7/70675* (2013.01); *G03F 1/70* (2013.01)

(58) Field of Classification Search
CPC ......... G03F 1/70; G03F 7/705; G03F 7/70675
See application file for complete search history.

(56) References Cited

U.S. PATENT DOCUMENTS

| 6,046,792 A | 4/2000 | Van Der Werf et al. |
| 6,961,116 B2 | 11/2005 | Den Boef et al. |

(Continued)

FOREIGN PATENT DOCUMENTS

| CN | 101458444 | 6/2009 |
| TW | 201602717 | 1/2016 |

(Continued)

OTHER PUBLICATIONS

International Search Report and Written Opinion issued in corresponding PCT Patent Application No. PCT/EP2019/080996, dated Dec. 3, 2019.

(Continued)

*Primary Examiner* — Deoram Persaud
(74) *Attorney, Agent, or Firm* — Pillsbury Winthrop Shaw Pittman LLP

(57) ABSTRACT

A method for determining a target feature in a model of a patterning process based on local electric fields estimated for the patterning process is described. The method includes obtaining a mask stack region of interest. The mask stack region of interest has one or more characteristics associated with propagation of electromagnetic waves through the mask stack region of interest. The mask stack region of interest includes the target feature. The method includes estimating a local electric field based on the one or more characteristics associated with the propagation of electromagnetic waves through the mask stack region of interest.

(Continued)

The local electric field is estimated for a portion of the mask stack region of interest in proximity to the target feature. The method includes determining the target feature based on the estimated local electric field.

20 Claims, 14 Drawing Sheets

(56) References Cited

U.S. PATENT DOCUMENTS

| | | | |
|---|---|---|---|
| 10,522,428 B2 * | 12/2019 | deVilliers | ............ G03F 7/2051 |
| 2006/0066855 A1 | 3/2006 | Boef et al. | |
| 2006/0286690 A1 | 12/2006 | Cao | |
| 2010/0175042 A1 | 7/2010 | Tirapu Azpiroz et al. | |
| 2011/0027704 A1 | 2/2011 | Cramer et al. | |
| 2011/0043791 A1 | 2/2011 | Smilde et al. | |
| 2012/0242970 A1 | 9/2012 | Smilde et al. | |

FOREIGN PATENT DOCUMENTS

| | | |
|---|---|---|
| WO | 02073506 | 9/2002 |
| WO | 2009078708 | 6/2009 |
| WO | 2009106279 | 9/2009 |

OTHER PUBLICATIONS

European Search Report issued in corresponding European Patent Application No. EP18211056, dated May 17, 2019.

* cited by examiner

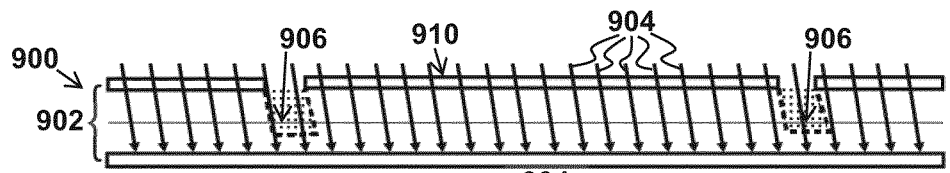
FIG. 9A
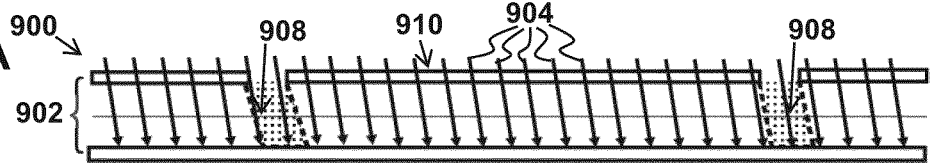
FIG. 9B
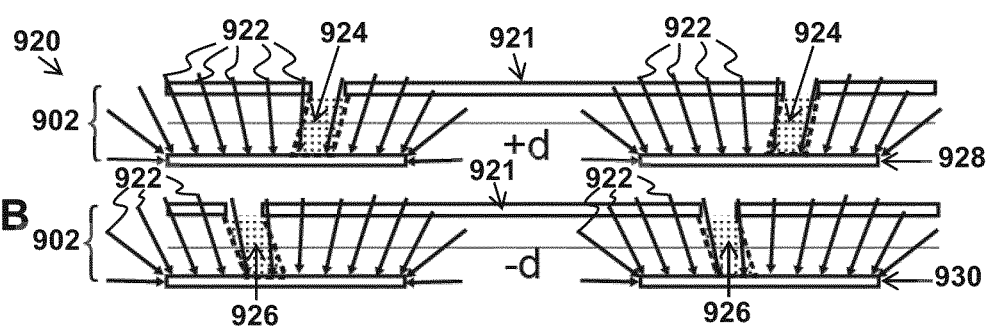
FIG. 9C
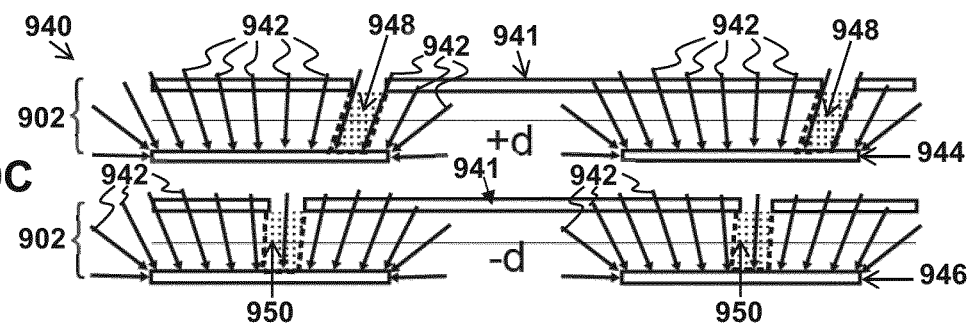
FIG. 9D
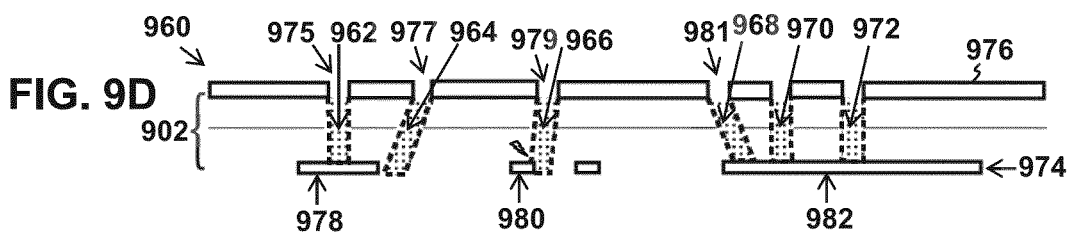
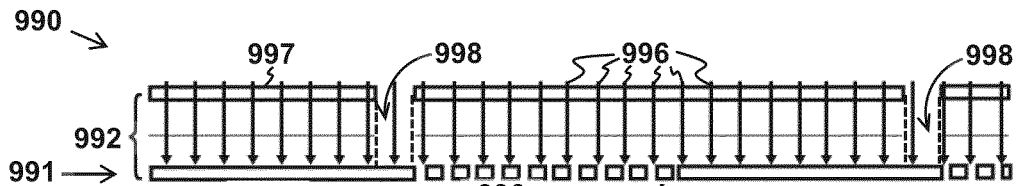
FIG. 9E
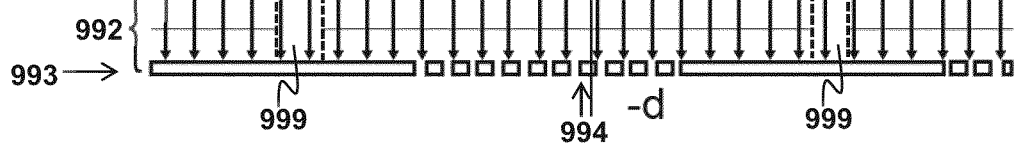

METHOD FOR ADJUSTING A TARGET FEATURE IN A MODEL OF A PATTERNING PROCESS BASED ON LOCAL ELECTRIC FIELDS

CROSS-REFERENCE TO RELATED APPLICATIONS

This application is the U.S. national phase entry of PCT Patent Application No. PCT/EP2019/080996 which was filed Nov. 12, 2019, which claims the benefit of priority of European Patent Application No. 18211056.9 which was filed on Dec. 7, 2018 and which is incorporated herein in its entirety by reference.

TECHNICAL FIELD

The description herein relates generally to mask manufacturing and patterning processes. More particularly, the description relates to an apparatus and a method for adjusting a target feature in a model of a patterning process based on local electric fields estimated for the patterning process.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating, and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, a method for adjusting a target feature in a model of a patterning process based on local electric fields estimated for the patterning process is provided. The method comprises obtaining, with a hardware computer system, a mask stack region of interest. The mask stack region of interest has one or more characteristics associated with propagation of electromagnetic waves through the mask stack region of interest. The mask stack region of interest includes the target feature. The method comprises estimating, with the hardware computer system, a local electric field based on the one or more characteristics associated with the propagation of electromagnetic waves through the mask stack region of interest. The local electric field is estimated for a portion of the mask stack region of interest in proximity to the target feature. The method comprises adjusting, by the hardware computer system, the target feature based on the estimated local electric field.

In an embodiment, adjusting the target feature based on the estimated local electric field comprises determining, by the hardware computer system, an effect of the estimated local electric field on the target feature during an etch of the patterning process, or an effect of the estimated local electric field and the target feature on the etch, and adjusting, by the hardware computer system, the target feature based on the estimated effect on the target feature during the etch.

In an embodiment, determining the effect of the estimated local electric field on the target feature comprises determining, by the hardware computer system, an image charge on conducting components in the portion of the mask stack region of interest in proximity to the target feature and/or solving, by the hardware computer system, Poisson's Equation to determine the local electric field.

In an embodiment, the target feature is a metrology target design. In an embodiment, the method comprises iteratively repeating, by the hardware computer system, the estimating of the local electric field and the adjusting of the target feature one or more times to enhance the metrology target design. In an embodiment, the method further comprises enhancing, with the hardware computer system, the metrology target design to reduce an estimated difference between an overlay measured after photo resist development (after development inspection—ADI) and an overlay measured after an etch (after etch inspection—AEI) of the patterning process. In an embodiment, the difference between ADI and AEI is an overlay penalty (ADI-AEI). In an embodiment, the method further comprises determining, with the hardware computer system, a correction for an AEI overlay measurement, and/or determining the AEI overlay measurement, based on the enhanced metrology target design.

In an embodiment, the adjusting of the target feature one or more times to enhance the metrology target design comprises one or more of adjusting, by the hardware computer system, placement of metrology target features relative to each other, placement of the metrology target relative to other features in a mask layout design, or adding, by the hardware computer system, one or more dummy features to the metrology target design.

In an embodiment, the one or more characteristics associated with propagation of electromagnetic waves through the mask stack region of interest comprise stack characteristics including one or more of layer properties, stack design rules, or layer integration requirements.

In an embodiment, the one or more characteristics associated with propagation of electromagnetic waves through the mask stack region of interest comprise metrology target design characteristics including one or more of a top grating design, contrast, or a bottom grating design.

In an embodiment, the target feature is a mask layout design. In an embodiment, the method further comprises iteratively repeating, by the hardware computer system, the estimating of the local electric field and the adjusting of the target feature one or more times to enhance the mask layout design.

In an embodiment, the adjusting of the target feature one or more times to enhance the mask layout design comprises one or more of adjusting, by the hardware computer system, feature placement in the mask layout design, or adding, by the hardware computer system, one or more dummy features to the mask layout design.

In an embodiment, the adjusting of the target feature one or more times to enhance the mask layout design comprises (1) determining, by the hardware computer system, an edge placement, (2) determining, by the hardware computer system, the effect of the estimated local electric field on the mask layout design during the etch of the patterning process based on the edge placement, and (3) adjusting, by the hardware computer system, the mask layout design based on the effect estimated based on the edge placement.

In an embodiment, the one or more characteristics associated with propagation of electromagnetic waves through the mask stack region of interest comprise mask layout design characteristics including an arrangement of features relative to each other, proximity of conducting portions of individual layers to each other, or a location of the mask stack region of interest relative to an edge and/or a center of a wafer in the model of the patterning process.

In an embodiment, the method further comprises outputting, by the hardware computer system, and indication of the estimated local electric field and/or the effect of the estimated local electric field on the target feature for review by a user; receiving entries and/or selections, by the hardware computer system, from the user that indicate adjustments to the target feature desired by the user; and adjusting, by the hardware computer system, the target feature based on the estimated local electric field and the desired adjustments.

In an embodiment, the method further comprises adjusting, by the hardware computer system, the target feature based on the estimated local electric field to facilitate three-dimensional metrology.

According to another embodiment, a computer program product is provided. The computer program product comprises a non-transitory computer readable medium having instructions recorded thereon, the instructions when executed by a computer implementing the method described above.

BRIEF DESCRIPTION OF THE DRAWINGS

The above aspects and other aspects and features will become apparent to those ordinarily skilled in the art upon review of the following description of specific embodiments in conjunction with the accompanying figures, wherein:

FIG. 9A illustrates two modeled cross sections of layers of a portion of a wafer stack, according to an embodiment.

FIG. 9B illustrates two modeled cross sections of layers of another portion of the wafer stack, according to an embodiment.

FIG. 9C illustrates two modeled cross sections of layers of another portion of the wafer stack, according to an embodiment.

FIG. 9D illustrates another modeled cross section of layers of another portion of the wafer stack, according to an embodiment.

FIG. 9E illustrates two modeled cross sections of layers of a portion of a metrology target that have been enhanced using the present systems and/or methods by adding substructures and/or dummy features to the grating design based on the local electric field associated with that portion of the metrology target, according to an embodiment.

DETAILED DESCRIPTION

Figure 1:
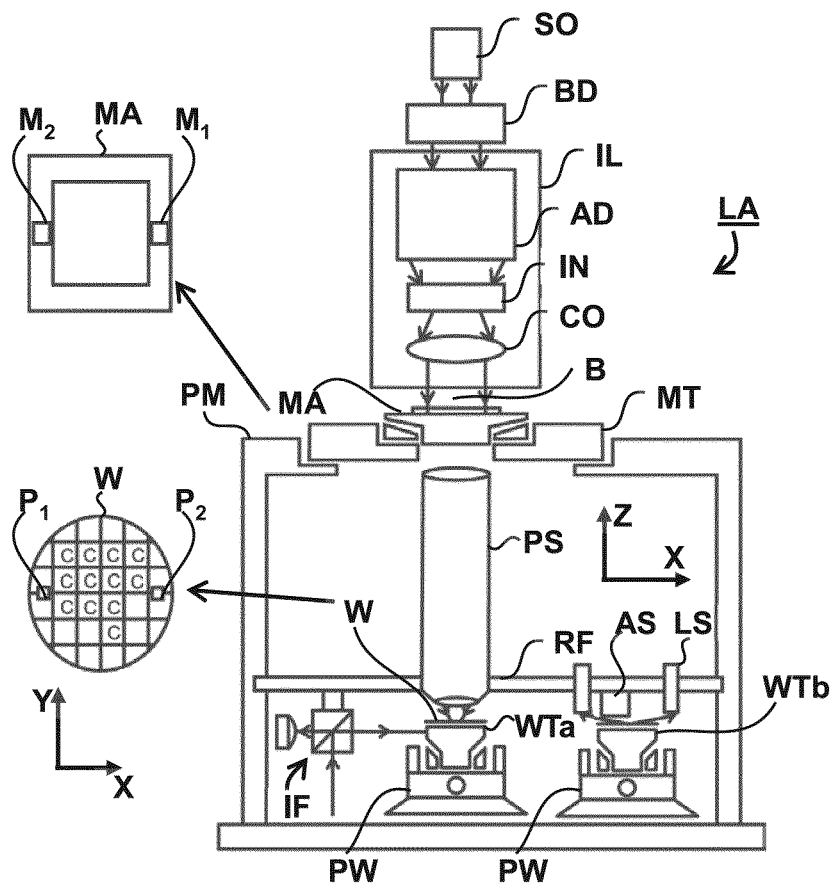
FIG. 1 schematically depicts a lithography apparatus, according to an embodiment.

The description herein relates generally to mask manufacturing and patterning processes. More particularly, the description relates to apparatuses or methods for adjusting a target feature in a model of a patterning process based on local electric fields estimated for the patterning process. This may facilitate determining an etch profile of a layer (or a portion of a layer, e.g., at or near a metrology target) of a wafer for simulation systems and/or have other purposes. These simulation systems may use the determined etch profile during alignment metrology target design, or design of other product features, as non-limiting examples, or in other operations.

As described in more detail below, overlay is an indication of a relative shift between a current layer of a wafer and the previous layer. Overlay is often determined based on the optical response of metrology marks included in scribe lines. The metrology marks and the optical response are typically modeled using software tools such as ASML Design 4 Control (D4C) and YieldStar to facilitate optimization of the wafer manufacturing recipe and metrology mark design (e.g., to reduce overlay and/or for other purposes) before a wafer is physically manufactured.

A model is used in typically used in overlay and metrology mark design for patterning process definition (e.g., to model or otherwise determine etch profiles). For example, D4C or other similar tools need an etch profile (among many other process related inputs) to construct a "stack" that models an actual wafer for accurate simulation. However, a typical model is overly simplistic (e.g., the model uses a global electric field for an etch tool). Etch effects on a wafer may not be well described by the model, which decreases simulation accuracy, and may result in poor correlation between simulated overlay measurements and actual overlay measurements. YieldStar (for example) or other scanner metrology mark signals are sensitive to modeled post-etch profiles. Etch profile differences between modeled and actual profiles are often caused by a model's inability to accurately account for local electric fields.

For example, it is generally known that the global electric field distribution inside an etch tool has a significant effect on how the structures defined in photo resist will be transferred into the underlying substrate. This effect can be characterized by considering the difference between the overlay measured after photo resist development (after development inspection, or ADI) and the overlay that is measured after etch (after etch inspection, or AEI). Etch tools are equipped with a focus ring. The focus ring (a consumable) is etched along with a wafer and this influences the electric field homogeneity close to the wafer edge. This, in turn, influences an etch induced overlay penalty (ADI-AEI). The electric field inhomogeneity due to the focus ring wear can be corrected by actuating the focus ring. The present systems and methods consider the effect of the local electric fields and their impact on overlay registration and device features after etch.

The present systems and methods are described herein in the context of metrology mark and other wafer feature generation, but this is not intended to be limiting. The present systems and methods may be generally applied to a number of different processes where estimating the effect of local electric fields is useful. The present systems and methods facilitate enhanced (relative to prior art systems) and/or otherwise more accurate modeling and/or determination of an etch profile, for example. This more accurate modeling and/or determination of an etch profile may enhance determination of the relative shift between a current layer of a wafer and the previous layer—overlay, facilitate a decrease in the relative shift between the current layer of a wafer and the previous layer, facilitate enhanced wafer feature design and/or enhanced wafer feature placement, and/or have other purposes. As described herein, overlay is often determined based on the optical response of metrology marks included in scribe lines. In some embodiments, the present systems and methods generate a more accurate (relative to prior art systems) metrology target model, which in turn, facilitates more accurate (relative to prior art systems) determination of overlay or other parameters.

The following paragraphs describe several components of a system and/or related systems, as well as methods, for adjusting a target feature in a model of a patterning process based on local electric fields estimated for the patterning process. As described above these simulation systems may use estimated local electric fields during alignment metrology target design, or wafer feature design, for example, or during other operations.

Although specific reference may be made in this text to the manufacture of integrated circuits (ICs), it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

FIG. 1 schematically depicts an embodiment of a lithographic apparatus LA. The apparatus comprises:
- an illumination system (illuminator) IL configured to condition a radiation beam B (e.g. UV radiation, DUV radiation, or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) configured to hold a substrate (e.g. a resist-coated wafer) W and coupled to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in a target portion of the device, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z-axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus may be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of the patterns on a patterning device or an area thereof may be obtained by merging (e.g., overlapping) process windows of each individual pattern. The boundary of the process window of a group of patterns comprises boundaries of process windows of some of the individual patterns. In other words, these individual patterns limit the process window of the group of patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that other patterns are not defective.

Figure 2:
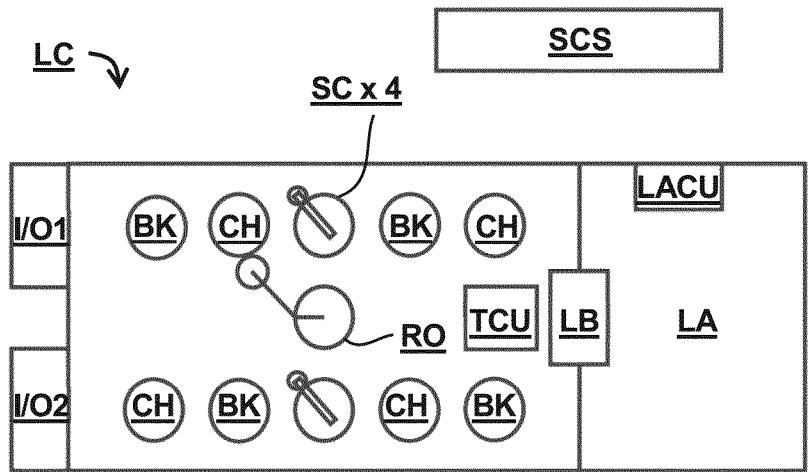
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system MET that measures some or all of the substrates W that have been processed in the lithocell or other objects in the lithocell. The metrology system MET may be part of the lithocell LC, for example, and/or it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist (ADI) but before etching, or may be performed after-etch (AEI), or both as described herein.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as the ASML YieldStar metrology tool, the ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions that meet specifications.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
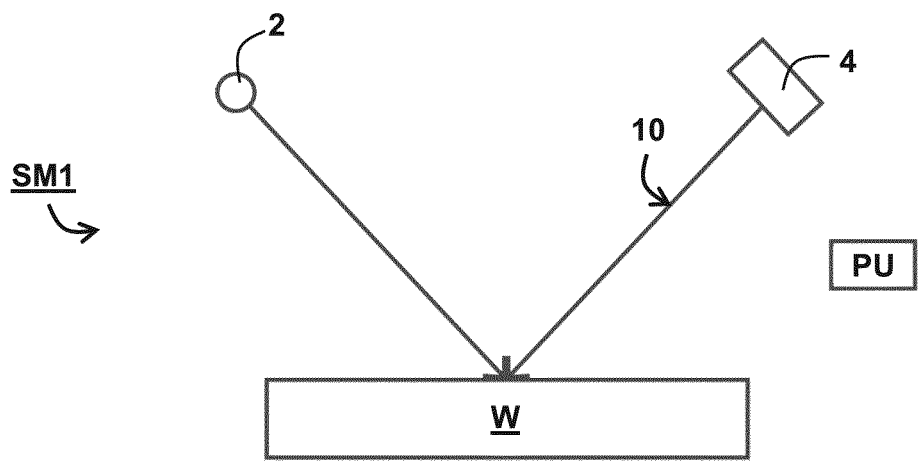
FIG. 3 schematically depicts an example inspection apparatus and metrology technique, according to an embodiment.
Figure 3:
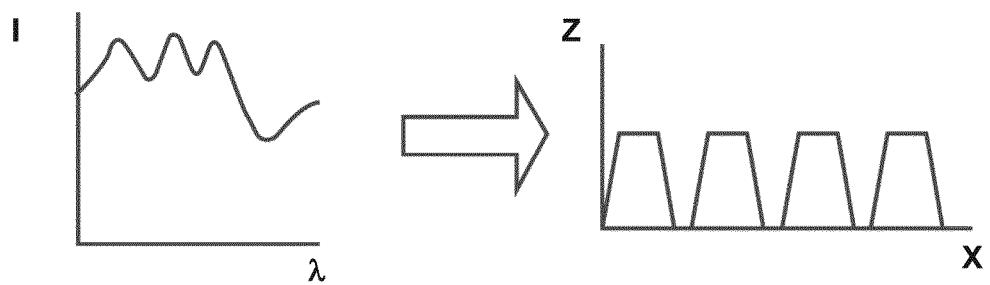

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left of FIG. 3. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
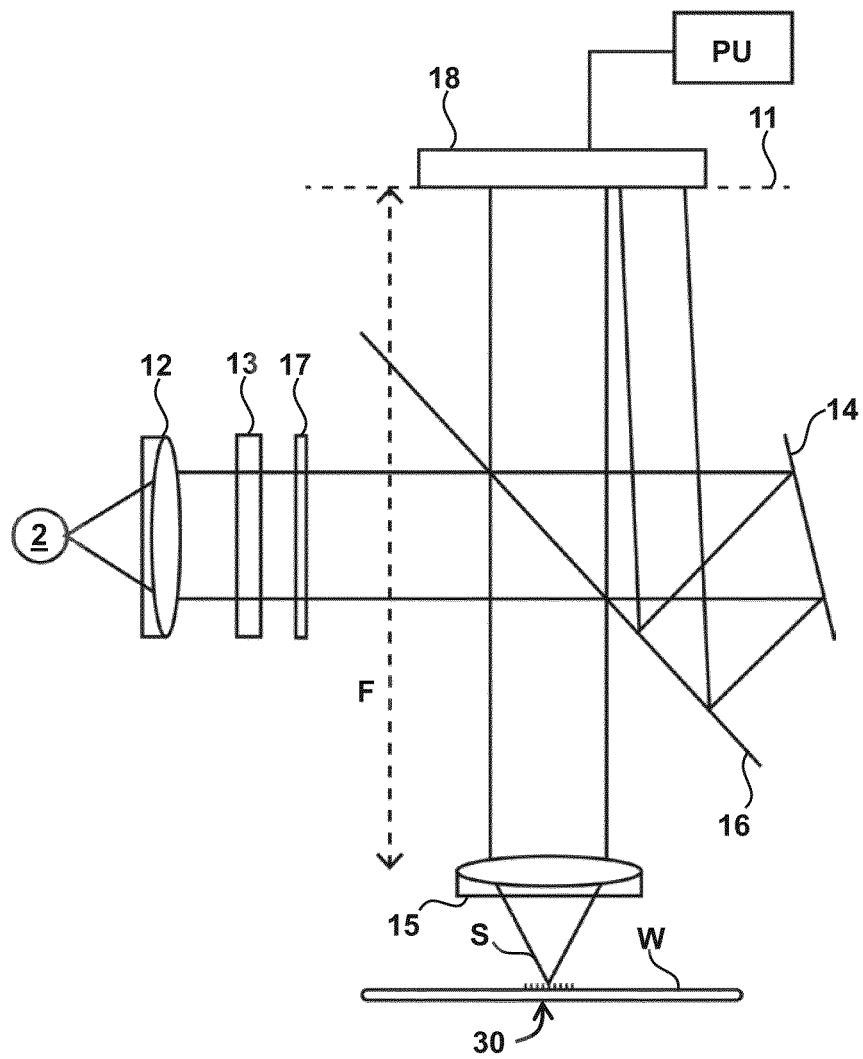
FIG. 4 schematically depicts an example inspection apparatus, according to an embodiment.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over one.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features that make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
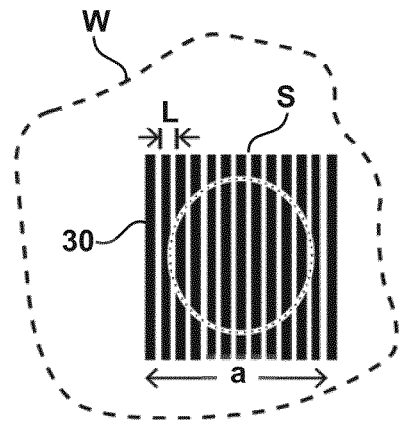
FIG. 5 illustrates the relationship between an illumination spot of an inspection apparatus and a metrology target, according to an embodiment.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 (FIG. 4) may be configured to provide illumination of a uniform intensity across a back focal plane of objective 15. Alternatively, by, e.g., including an aperture in the illumination path, illumination may be restricted to on axis or off axis directions.

Figure 6:
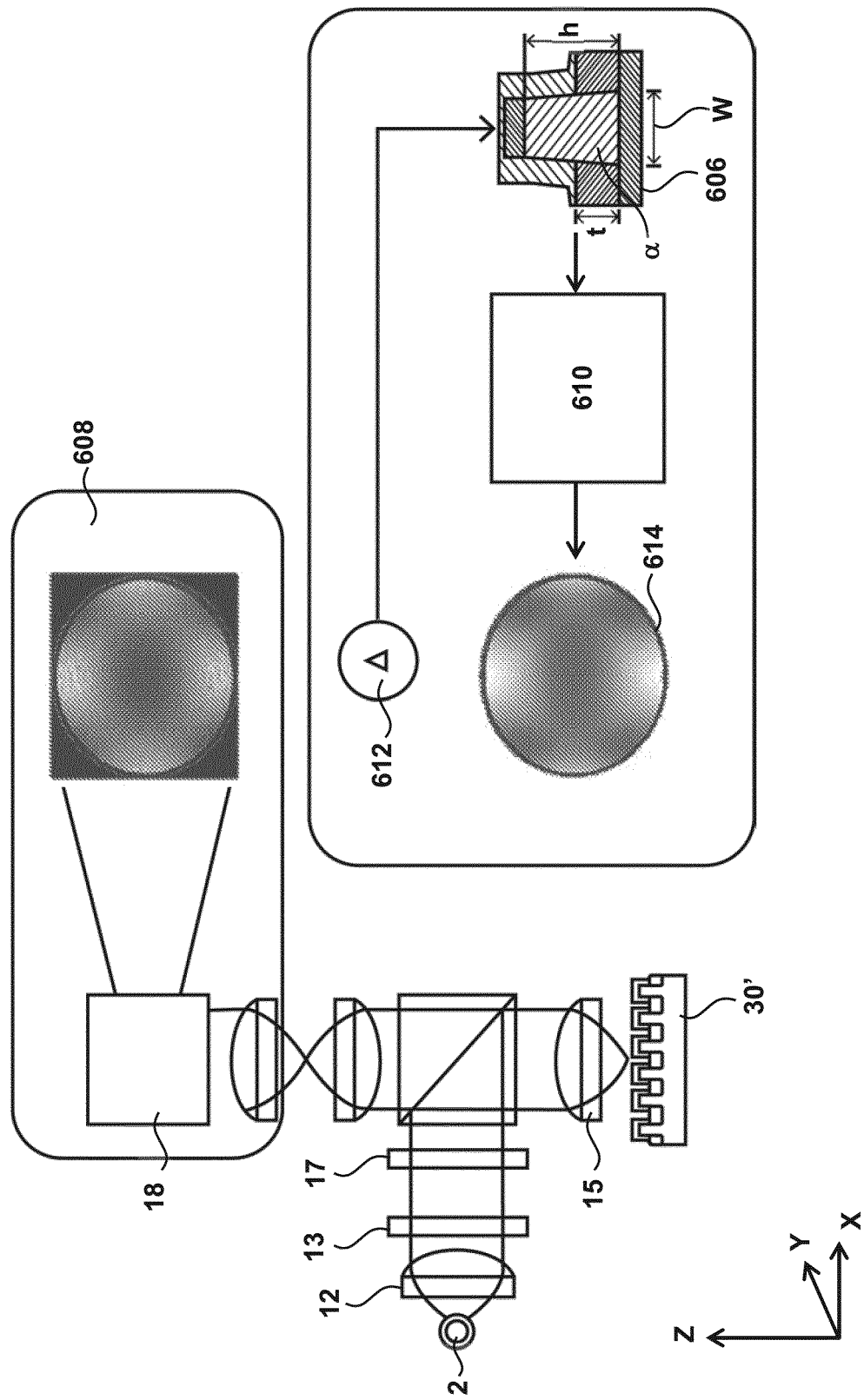
FIG. 6 schematically depicts a process of deriving a plurality of variables of interest based on measurement data, according to an embodiment.

FIG. 6 schematically depicts an example process of the determination of the value of one or more variables of interest of a target pattern 30 based on measurement data obtained using metrology. Radiation detected by the detector 18 provides a measured radiation distribution 608 for target 30. For a given target 30, a radiation distribution 612 can be computed/simulated from a parameterized model 606 using, for example, a numerical Maxwell solver 610. The parameterized model 606 shows example layers of various materials making up, and associated with, the target. The parameterized model 606 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 608 is then compared at 612 to the computed radiation distribution 612 to determine the difference between the two. If there is a difference, the values of one or more of the variables of the parameterized model 606 may be varied, a new computed radiation distribution 612 calculated and compared against the measured radiation distribution 608 until there is sufficient match between the measured radiation distribution 608 and the computed radiation distribution 612. At that point, the values of the variables of the parameterized model 606 provide a good or best match of the geometry of the actual target 30. In an embodiment, there is sufficient match when a difference between the measured radiation distribution 608 and the computed radiation distribution 612 is within a tolerance threshold.

Figure 7A:
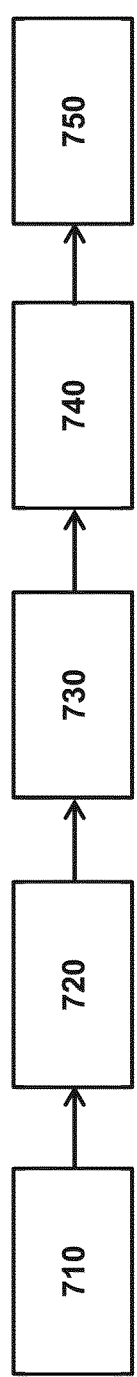
FIG. 7A is a flow chart showing various stages of a 'design for control' process flow, according to an embodiment.

FIG. 7A shows a flowchart that lists the main stages of a "design for control" (D4C) method. In stage 710, the materials to be used in the lithography process are selected. The materials may be selected from a materials library interfaced with D4C through an appropriate GUI. In stage 720, a lithography process is defined by entering each of the process steps, and building a computer simulation model for the entire process sequence. In stage 730, a metrology target is defined, i.e. dimensions and other characteristics of various features included in the target are entered into the D4C program. For example, if a grating is included in a structure, then number of grating elements, width of individual grating elements, spacing between two grating elements etc. have to be defined. In stage 740, the 3D geometry is created. This step also takes into account whether there is any information relevant to a multi-layer target design, for example, the relative shifts between different layers. This feature enables multi-layer target design. In stage 750, the final geometry of the designed target is visualized. As will be explained in greater detail below, not only the final design is visualized, but as the designer applies various steps of the lithography process, he/she can visualize how the 3D geometry is being formed and changed because of process-induced effects (e.g., caused by local electric fields as described herein). For example, the 3D geometry after resist patterning is different from the 3D geometry after resist removal and etching.

Figure 7B:
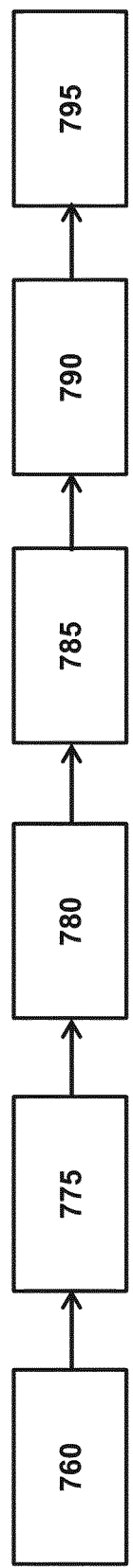
FIG. 7B is a block diagram showing various stages for visualization, according to an embodiment.

An important aspect of the present disclosure is that the target designer is enabled to visualize the stages of the method to facilitate their perception and control during modeling and simulation. Different visualization tools, referred to as "viewers," are built into the D4C software. For example, as shown in FIG. 7B, a designer can view material plots 760 (and may also get a run time estimation plot) depending on the defined lithography process and target. Once the lithography model is created, the designer can view the model parameters through model viewer tool 775. Design layout viewer tool 780 may be used to view the design layout (e.g., visual rendering of the GDS file). Resist profile viewer tool 785 may be used to view pattern profiles in a resist. Geometry viewer tool 790 may be used to view 3D structures on a substrate. A pupil viewer tool 795 may be used to view simulated response on a metrology tool. Persons skilled in the art would understand that these viewing tools are available to enhance the understanding of the designer during design and simulation. One or more of these tools may not be present in some embodiments of D4C software, and additional viewing tools may be there in some other embodiments.

Figure 7C:
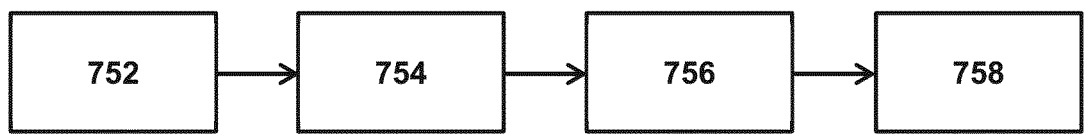
FIG. 7C is a flow chart showing how the 'design for control' process determines metrology target designs robust against process perturbations, according to an embodiment.

FIG. 7C shows a flow chart that illustrates how the D4C process increases efficiency in the overall simulation process by reducing the number of metrology targets selected for the actual simulation of the lithography process. As mentioned before, D4C enables designers to design thousands or even millions of designs. Not all of these designs may be robust against variations in the process steps. To select a subset of target designs that can withstand process variation, a lithographer may intentionally perturb one or more steps of the defined lithography process, as shown in block 752. The introduction of the perturbation alters the entire process sequence with respect to how it was originally defined. Therefore, applying the perturbed process sequence (block 754) alters the 3D geometry of the designed target too. A lithographer only selects the perturbations that show non-zero alternations in the original design targets and creates a subset of selected process perturbations (block 756). The lithography process is then simulated with this subset of process perturbations (block 758).

The manufacturing or fabrication of a substrate using the lithographic process (or patterning process in general) typically involves process variations. The process variations are not uniform across the substrate. For example, in deposition processes, films tend to be thicker at the center of the substrate and be thinner when close to edge. These systematic variations are usually reflected in measurements data as 'fingerprints', which are characteristics of a substrate based on known process conditions. In other words, there exists a stack on a substrate that has a spatial variation as a function of substrate coordinate. A stack comprises multiple layers formed on a substrate during the patterning process to form a selected pattern (e.g., a design pattern) on the substrate. Each layer of the stack can be associated with a thickness, material properties, electrical and/or magnetic properties, and features and related parameters of the patterning process (e.g. CD, pitch, overlay, etc.).

Figure 8A:
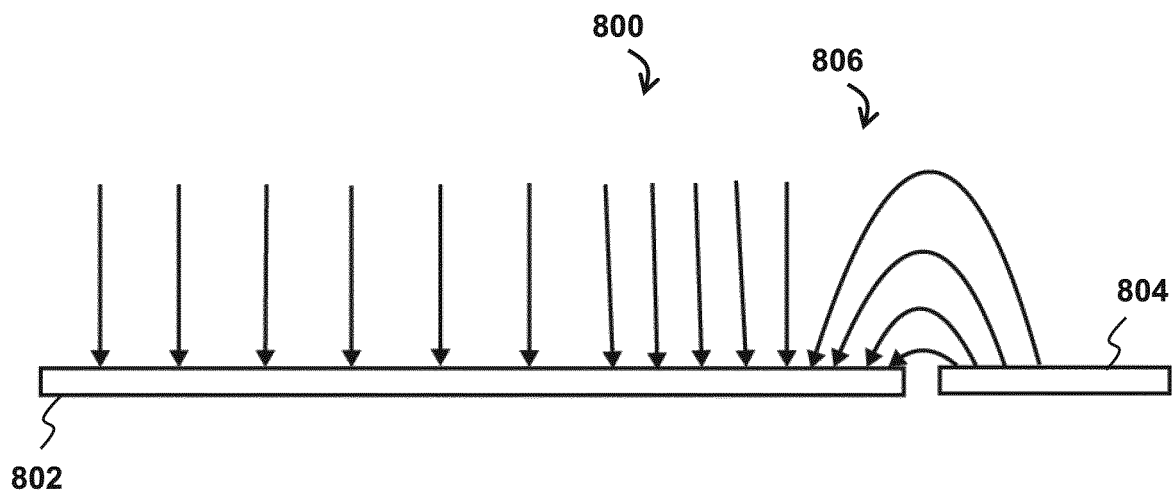
FIG. 8A illustrates a global electric field associated with a wafer and a focus ring, according to an embodiment.

As described above, the global electric field distribution inside an etch tool has a significant effect on how the structures defined in photo resist will be transferred into the underlying substrate. As an example, FIG. 8a illustrates a global electric field 800 associated with a wafer 802 and a focus ring 804. FIG. 8a illustrates a portion 806 of global electric field 800 that is affected by focus ring 804. Global electric field 800 including portion 806 that is affected by focus ring 804 causes a difference in after development inspection (ADI) and after etch in inspection (AEI) values (e.g., the ADI-AEI penalty), and/or may have other effects.

Apart from the global electric field distribution (e.g., introduced by the etch tool), local electric fields also have an impact on the after etch wafer structure (and thus the ADI-AEI penalty). Since features inside an integrated circuit are electrically conducting and either floating or at a fixed potential, they influence a local intra-field and/or intra-die local electric field and/or etch performance. In general, three levels of granularity may be considered that impact the local electric field distribution: intra-die pattern density, an overlay metrology target (or other wafer feature) itself, and the local device structures.

Figure 8B:
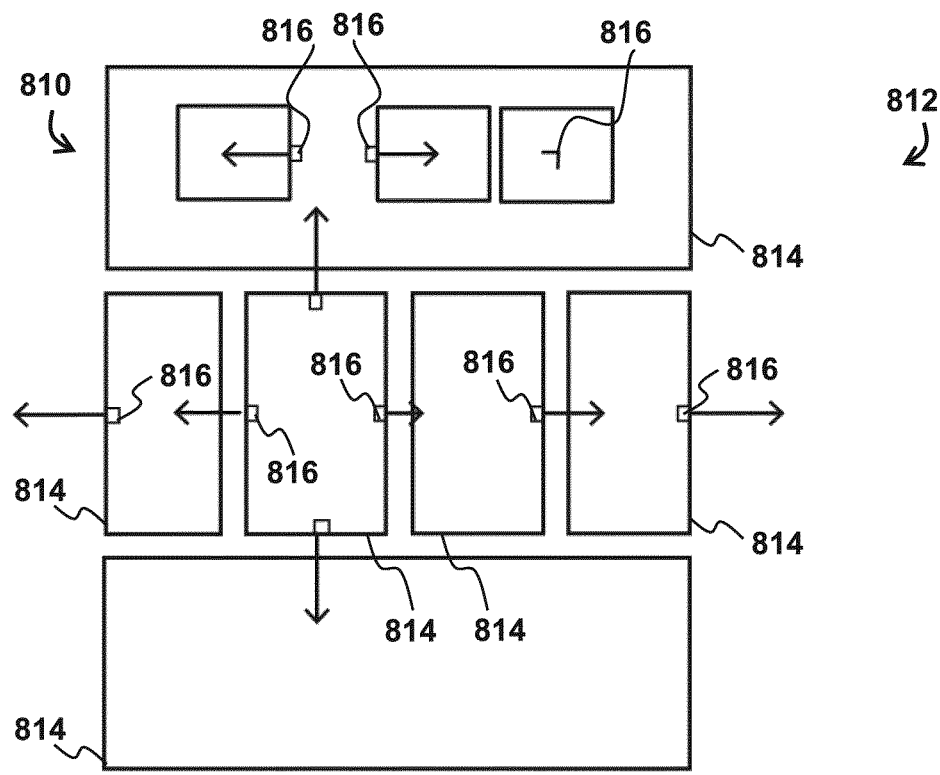
FIG. 8B illustrates modeled device structures on a wafer and the effect local electric fields impacted by a buried conducting wafer layer have on metrology targets or any other feature to be etched, according to an embodiment.

As a non-limiting example, FIG. 8b illustrates modeled device structures 810 on a wafer 812 and the effect local electric fields impacted by a buried conducting wafer layer 814 have on metrology targets 816 (or any other feature to be etched). In FIG. 8b, arrows 818 represent the ADI-AEI penalty (which can be thought of as a relative shift in position from a previous and/or intended location to a current and/or actual location on a layer of wafer 812) for each metrology target 816. The ADI-AEI penalty is caused by local electric fields impacted by buried conduction wafer layer 814. The size and direction of arrows 818 (e.g., the relative direction and amount of shift in location), for example, depend on the layout of buried conduction wafer layer 814, locations of metrology targets 816 relative to the different portions of buried conduction wafer layer 814, and/or other factors that impact local electric fields.

By way of additional non-limiting examples, FIG. 9a-9d illustrate impacts local electric fields may have on etch processes. FIG. 9a illustrates two modeled cross sections 900 of layers 902 of a portion of a wafer stack. As shown in FIG. 9a, local electric field 904 may influence whether partial 906 or full 908 etching occurs during an etch process.

In this example, local electric field 904 influences a tilt angle of the etch (e.g., an angle of the etch corresponds to an angle of local electric field 904). In the example shown in FIG. 9*a* (e.g., in conjunction with FIG. 8*b*), local electric fields 904 (e.g., disturbances caused by areas 814 shown in FIG. 8*b*) influence the etch direction of any patterned structure 910. The tilted local electric fields induced by different areas inside a chip cause different tilts in an etch in one area of a wafer compared to another, for example. Inside a die/chip, different conducting areas (e.g., buried layers 814) exist that influence the local electric field and hence the etch direction. The etch direction would be similar for target (e.g., Yield-star) top gratings or other device structures.

FIG. 9*b* illustrates two modeled cross sections 920 of layers 902 of another portion of the wafer stack. As shown in FIG. 9*b*, local electric field 922 influences etches 924 and 926 for +d and −d gratings (at OV=0 nm in this example) of the metrology target. Bottom (or otherwise lower or buried) gratings 928 and 930 may be conducting for example. In this example, ADI-AEI depends on local electric field 922, which is impacted by the presence of bottom conductive gratings 928 and 930. In other words, the conducting (e.g., Yieldstar) target (bottom grating) itself may cause a tilt in the etch direction of the top-grating. Other local surrounding structure of the metrology target (such as a design of top grating 921 and/or other structure) may also influence local electric field 922. ADI-AEI is a function of overlay (ADI). Often, a hard mask uses conducting material that influence the local electric fields. It can also be a dummy pattern surrounding a target.

FIG. 9*c* illustrates two modeled cross sections 940 of layers 902 of another portion of the wafer stack. As shown in FIG. 9*c*, local electric field 942 influences etches 948 and 950 for +d and −d gratings (at OV>0 nm in this example) of the metrology target. Bottom (or otherwise lower or buried) gratings 944 and 946 may again be conducting. As in FIG. 9*b*, ADI-AEI depends on local electric field 942 because of the presence of bottom conductive gratings 944 and 946. Other local surrounding structure of the metrology target (such as a design of top grating 941 and/or other structure) may also influence local electric field 942. ADI-AEI is again a function of overlay (ADI).

FIG. 9*d* illustrates another modeled cross section 960 of layers 902 of another portion of the wafer stack. FIG. 9*d* illustrates various contact hole etches 962, 964, 966, 968, 970, and 972 in the wafer stack. A shape, size, angle, and/or other characteristics of these contact hole etches may depend on surrounding conducting and/or charge carrying structures in the wafer stack. These characteristics may influence the local electric field around individual contact hole etches 962-972. The local electric field is not shown for clarity of FIG. 9*d*, but may include a local electric field similar to or the same as local electric fields 942, 922, and/or 904 shown in FIG. 9*a*-9*c*. As shown in FIG. 9*d*, a bottom (or otherwise lower or buried) layer 974 may be conducting. As shown in FIG. 9*d*, bottom conductive layer 974 may impact the local electric field such that different contact holes etch differently. In this example, the local electric field may influence the etch angle of one or more of the contact hole etches. For example, an etch angle of contact hole etch 962 may be generally vertical because a contact hole gap 975 in an upper layer 976 is generally aligned with the middle (or a non-edge location) of a portion 978 of bottom conductive layer 974. The same is true of contact hole etches 970 and 972. In contrast, an etch angle of contact hole etches 964, 966, and 968 may be angled because contact hole gaps 977, 979, and 981 in upper layer 976 are generally aligned with edge locations of portions 978, 980, and 982 of bottom conductive layer 974 (e.g., if local electric field arrows were drawn on FIG. 9*d*, the local electric field arrows would be angled at angles that correspond to the angles of contact hole etches 964, 966, and 968).

In some instances, a local electric field may cause unintended contact between a contact hole and underlying structure (e.g., resulting in a short). For example, as shown in FIG. 9*d*, the local electric field causes contact hole etch 966 to angle toward and touch portion 980 of bottom conductive layer 974. This unintended contact may cause an integrated circuit to malfunction, for example, or have other consequences. Other examples of negative effects of not considering local electric fields (on metrology targets as in FIG. 9*a*-9*c*, or on other wafer features such as contact holes as in FIG. 9*d*) are contemplated.

Current overlay metrology targets and/or other wafer features are typically optimized based on stack material properties and their sensitivity to processing perturbations (e.g., etch, CMP, layer thickness, etc.). Effects of a corresponding global electric field are often accounted for in process models. However, the impact of local electric fields near a target feature (e.g., a metrology target, IDM, SEM, e-test and/or other registration features, wafer alignment marks, one or more features in a mask layout design, and/or other wafer features) that are introduced by a local environment of the wafer at or near that target feature are not considered in prior systems. For example, as shown in FIG. 9*a*-9*d*, a local electric field impacted by a local structure of the top and/or bottom layers of a metrology target, which may affect etch depth, etch angle, and/or other characteristics of an etch process, is not considered in prior systems. Advantageously, the present systems and methods account for local electric fields during target feature (e.g., metrology target, and/or other mask layout design feature) optimization. The present systems and methods may enhance (or otherwise optimize) a target feature by adding substructures at or near a target feature (e.g., to a grating design), adjust feature (e.g., metrology target) placement with respect to surrounding mask or wafer structures, adding dummy features that influence the local electric fields, solving Poisson's equation to determine the strength and/or orientation of a given local electric field, and/or by performing other operations as described herein.

For example, continuing with FIG. 9*a*-9*d*, FIG. 9*e* illustrates two modeled cross sections 990 of layers 992 of a portion of a metrology target that has been enhanced using the present systems and/or methods by adding substructures and/or dummy features 994 to the grating design based on the local electric field 996 associated with that portion of the metrology target. As shown in FIG. 9*e*, local electric field 996 does not influence etches 998 and 999 for +d and −d gratings of the metrology target as in previous examples shown in FIGS. 9*b* and 9*c* (e.g., etches 998 and 999 are substantially vertically oriented relative to layers 992). This is because, although bottom (or otherwise lower or buried) gratings 991 and 993 may still be conducting, they now include substructures and/or dummy features 994. In this example, ADI-AEI depends on local electric field 996, which is impacted by the presence of bottom conductive gratings 991 and 993 with substructures and/or dummy features 994. A goal may be to make ADI-AEI zero by adding substructures. In the case where the electric field is perpendicular to the wafer surface, AEI is equal to ADI, for example. Other local surrounding structure of the metrology target (such as a design of top grating 997 and/or other structure) may also influence local electric field 922.

Figure 10:
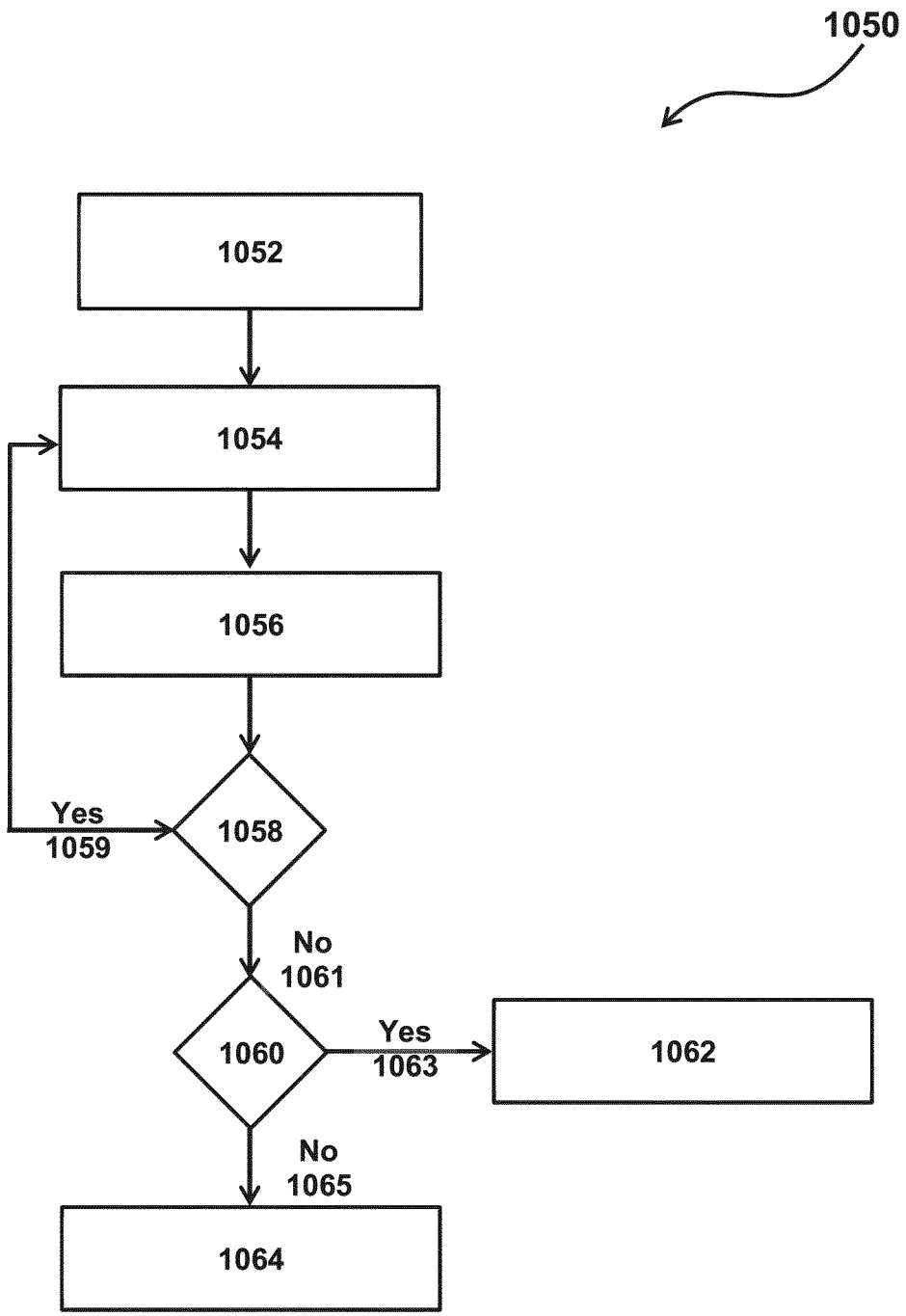
FIG. 10 illustrates a method for adjusting a target feature (e.g., a metrology target design) in a model of a patterning process based on local electric fields estimated for the patterning process, according to an embodiment.
Figure 11:
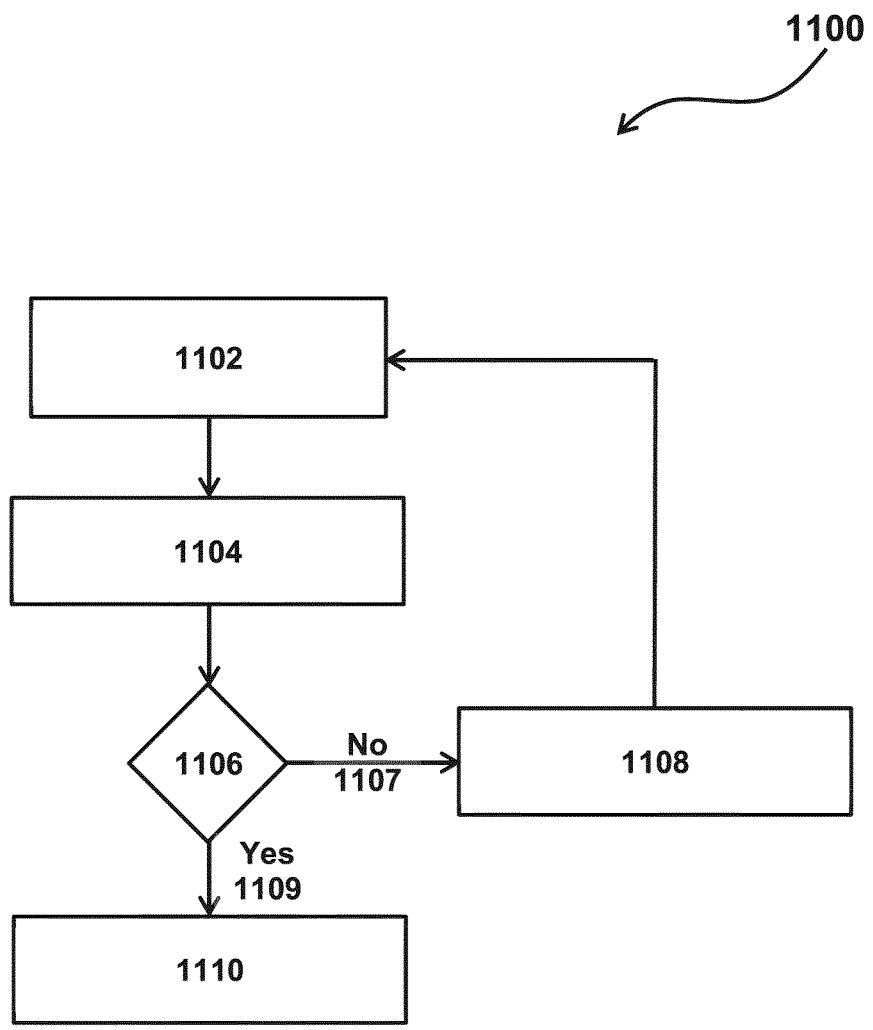
FIG. 11 illustrates another method for adjusting a target feature (e.g., a mask layout design) in a model of a patterning process based on local electric fields estimated for the patterning process, according to an embodiment.

FIG. 10 and FIG. 11 illustrate methods 1050 (FIG. 10) and 1100 (FIG. 11) for adjusting a target feature in a model of a patterning process based on local electric fields estimated for the patterning process. These methods may be used by a simulation system as described herein, or for other purposes. Method 1050 is described in the context of a metrology target design, and method 1100 is described in the context of a mask layout design, but this is not intended to be limiting. Method 1050 and 1100 may be generally applied to a number of different processes where determining an impact of local electric fields is useful. Methods 1050 and/or 1100 may be used to develop overlay metrology targets, mask layout designs, and/or any other integrated circuit features and/or other features that are substantially insensitive to local electric fields.

In some embodiments, method 1050 may be used to determine a (clean) ADI-AEI measurement for use as input for etch tool optimization and control, and/or for other purposes. As shown in FIG. 10, method 1050 comprises obtaining 1052 a mask stack region of interest. The mask stack region of interest has one or more characteristics associated with propagation of electromagnetic waves through the mask stack region of interest. For clarity, this refers to the detection wavelengths to measure the overlay (e.g., Yieldstar wavelengths). The static electric field is only present during etch inside the etch tool. In some embodiments, the mask stack region of interest is divided into sub regions such as layers. In some embodiments, obtaining 1052 the mask stack region of interest comprises obtaining the one or more characteristics associated with propagation of electromagnetic waves through the mask stack region of interest. In some embodiments, the one or more characteristics associated with propagation of electromagnetic waves through the mask stack region of interest comprise stack characteristics including one or more of layer properties, stack design rules, layer integration requirements, a layer interaction order, and/or other characteristics. In some embodiments (e.g., during the modeling phase to model the impact on the structure to be etched), the one or more characteristics associated with propagation of electromagnetic waves through the mask stack region of interest include a global electric field associated with the mask stack region of interest (but physically, the one or more characteristics associated with the propagation of electromagnetic waves through the mask stack region of interest include the global electric field only during etch of the patterned layer and not during the overlay measurements after etch (AEI)).

In some embodiments, the one or more characteristics associated with propagation of electromagnetic waves through the mask stack region of interest comprise characteristics of the mask stack region of interest that cause and/or impact a local electric field. Characteristics of the mask stack region of interest that cause and/or impact a local electric field include stack layer thicknesses, materials used to form stack layers, a conductivity of stack layers or portions of stack layers, a stack layer order (e.g., conductive layers separated by an insulating layer), a proximity of specific layers (e.g., a distance between two conducting layers), a temperature of the mask stack region of interest, a pressure inside an etch chamber, an RF power and/or other characteristics.

The mask stack region of interest may be a target area of a photolithography mask model, for example. The mask stack region of interest includes the target feature. The target feature may include one or more layers, one or more materials, one or more apertures, and/or other features. In some embodiments, one or more material properties may be associated with one of more of the layers. Individual layers may have their own individual parameters. In some embodiments, as in method 1050, the target feature is a metrology target design.

Method 1050 includes obtaining 1054 the metrology target design. In some embodiments, obtaining the metrology target design comprises obtaining and/or determining metrology target design characteristics including one or more of a top grating design, contrast, a bottom grating design, materials used to form the layers of the metrology target, a proximity of features of the metrology target design, and/or other metrology target design characteristics. In some embodiments, the one or more characteristics associated with propagation of electromagnetic waves through the mask stack region of interest comprise the metrology target design characteristics.

In some embodiments, obtaining the mask stack region of interest, the metrology target design, characteristics associated with the mask stack region of interest and/or the metrology target design (e.g., operations 1052 and/or 1054), and/or other information may include electronically accessing this information via databases of one or more external computing systems, accessing this information in local electronic storage, receiving or accessing this information via network communications, receiving this information via upload, download, or other electronic file transfer from non-transitory storage media and/or other electronic storage sources, or obtaining this information by other methods. As an example, designed dimensions and/or other features of a mask stack region of interest and/or the metrology target design may be entered or selected by, or otherwise communicated from, a user via a user interface associated with design software (e.g., D4C) or other resources. As another example, dimensions or other features of a mask stack region of interest and/or the metrology target design may be measured as part of operation 1052 and/or 1054. Such measurements may be taken, for example, on an immediately previous layer of a physical or modeled wafer going through a fabrication process. In some embodiments, the mask stack region of interest and/or the metrology target design may also be built based on assumptions made by a designer, the system, or other sources.

Method 1050 comprises estimating 1056 the local electric field based on the one or more characteristics associated with the propagation of electromagnetic waves through the mask stack region of interest. The local electric field is estimated for a portion of the mask stack region of interest in proximity to the metrology target design (or any other target feature the target feature).

Method 1050 comprises adjusting 1058 the metrology target design based on the estimated local electric field and/or other information. The metrology target design may be adjusted one or more times based on the local electric field and/or the other information to enhance the metrology target design. In some embodiments, adjusting 1058 the metrology target design one or more times to enhance the metrology target design comprises one or more of adjusting placement of components of the metrology target relative to each other, adjusting placement of the metrology target relative to other features in a mask layout design, adding one or more dummy features to the metrology target design, and/or other operations. For example, previously discussed FIG. 9e illustrates a metrology target that has been enhanced according to method 1050 by adding substructures and/or dummy features 994 to the grating design based on the local electric field 996 associated with that portion of the metrology target. As shown in FIG. 9e, local electric field 996 does not influence etches 998 and 999 for +d and −d gratings of the metrology target as in previous examples shown in FIGS. 9b and 9c (e.g., etches 998 and 999 are substantially vertically oriented relative to layers 992). This is because, although bottom (or otherwise lower or buried) gratings 991 and 993 may still be conducting, they now include substructures and/or dummy features 994. Returning to FIG. 10, in some embodiments, adjusting 1058 the metrology target design based on the estimated local electric field and/or other information comprises optimizing the metrology target design, for example.

In some embodiments, estimating 1056 the local electric field and/or adjusting 1058 the metrology target design based on the estimated local electric field and/or other information comprises determining an effect of the estimated local electric field on the metrology target design during an etch of the patterning process, and adjusting the metrology target design based on the estimated effect on the metrology target design during the etch. In some embodiments, determining the effect of the estimated local electric field on the metrology target design comprises determining an induced charge on conducting components in the portion of the mask stack region of interest in proximity to the metrology target design (e.g., a top or bottom grating of the metrology target, conductive wafer features in proximity to the metrology target, etc.), solving Poisson's Equation to determine the strength and/or orientation of the local electric field caused by such features, and/or other operations.

By way of a non-limiting example, solving Poisson's equation will be done numerically. A constant potential may be assigned to two large capacitor plates (representing the etch tool). Alternatively, a constant electric field may be assumed at the location of the features to be etched. Conducting features will have a constant potential (inside the conductor the E-field is zero). By solving Poisson's Equation numerically outside the conducting feature, one obtains the potential distribution. The derivative of the potential distribution is proportional to the electric field. The induced charge on a buried conducting feature can be calculated as well, but this is not required.

In some embodiments, one or more of operations 1052-1058 of method 1050 may comprise outputting an indication of the characteristics of the mask stack region of interest, the metrology target design, the estimated local electric field and/or the effect of the estimated local electric field on the metrology target design, and/or other information for review by a user. In some embodiments, these operations may include receiving entries and/or selections from the user (e.g., via one or more computer system components described below) that indicate adjustments to the mask stack region of interest, the metrology target design, the estimated local electric field and/or the effect of the estimated local electric field on the metrology target design, and/or other information desired by the user. Method 1050 may include repeating one or more of operations 1052-1058 to adjust the metrology target design based on an updated estimated local electric field generated from the inputs and/or selections made by the user.

In some embodiments, method 1050 comprises iteratively repeating the estimating of the local electric field and/or the impact of the local electric field on the etch of the metrology target design, and the adjusting of the target feature one or more times to enhance the metrology target design. For example, if the metrology target design is to be further enhanced ("yes" 1059 in FIG. 1050), a current version of the metrology target design is fed back into operation 1054 and operations 1054 and 1056 are iteratively repeated as described above.

In some embodiments, method 1050 further comprises (following "no" 1061 in FIG. 10) enhancing the metrology target design based on the local electric field to reduce an overlay penalty (ADI-AEI). In some embodiments, method 1050 further comprises determining 1060 whether a correction for an AEI overlay measurement is necessary (and, following "yes" 1063 in FIG. 10, determining and providing 1062 that correction if it is necessary), and/or, following "no" 1065 in FIG. 10, determining 1064 the AEI overlay measurement, based on the enhanced metrology target design. One may use operations 1060, 1062, and/or 1063, for example, on existing overlay targets that already are in use. The overlay readings after etch may be corrected to obtain a more accurate overlay measurement. One may also encounter use cases where the overlay target contrast becomes insufficient when sub-structures are added. In this case, the overlay penalty during the measurement can be corrected afterwards.

In some embodiments, method 1100 shown in FIG. 11 may be used to develop a device local electric field-aware layout optimization, and/or for other purposes. A device local electric field-aware layout optimization may, for example, be achieved by mask splitting in multi-patterning applications and/or other operations. With reference to FIG. 9d (device pattern), for example, and/or other figures, method 1100 is configured such that the device pattern (e.g. contact holes) are placed such that they are not negatively impacted by the etch process and cause defects. Method 1100 is meant to optimize the mask(s) used for exposure, taking the conductive layer that is already present on the wafer. Alternatively, sub-structures can be added to the conducting layer to "guide" the etch direction.

In method 1100 shown in FIG. 11 the target feature is a mask layout design. Similar to method 1050 shown in FIG. 10, as shown in FIG. 11, method 1100 comprises obtaining 1102 the mask stack region of interest. Again, the mask stack region of interest may be a target area of a photolithography mask model that includes the mask layout design, for example. In embodiments where the target feature is the mask layout design, the mask stack region of interest may comprise a relatively large portion (up to an including all) of a mask and/or wafer. The mask layout design may include one or more layers, one or more materials, one or more apertures, and/or other features. In some embodiments, one or more material properties may be associated with one of more of the layers. Individual layers may have their own individual parameters that cause and/or impact local electric fields in the mask stack region of interest. In some embodiment, the one or more characteristics associated with propagation of electromagnetic waves through the mask stack region of interest comprise mask layout design characteristics including an arrangement of features relative to each other, proximity of conducting portions of individual layers to each other, a location of a portion of a mask layout design relative to an edge and/or a center of a wafer in the model of the patterning process, and/or other characteristics. Operation 1102 includes obtaining the characteristics of the mask stack region of interest, characteristics of the mask layout design, and/or other information associated with propagation of electromagnetic waves through the mask stack region of interest, a global electric field associated with the mask stack region of interest, characteristics that cause and/or impact a local electric field, and/or other information.

Method 1100 comprises estimating 1104 the local electric field based on the one or more characteristics associated with the propagation of electromagnetic waves through the mask stack region of interest. The local electric field may be estimated for one or more individual areas of the mask layout design and/or may be estimated across the mask layout design. Method 1100 also comprises adjusting 1106 the mask layout design based on the estimated local electric field(s) and/or other information. The mask layout design may be adjusted one or more times based on the local electric field and/or other information to enhance the mask layout design. In some embodiments, adjusting 1106 the mask layout design one or more times to enhance the mask layout design comprises one or more of adjusting placement of features of the mask layout design relative to other features in a mask layout design, adding one or more dummy features to the mask layout design, and/or other operations. In some embodiments, adjusting 1106 the mask layout design based on the estimated local electric field(s) and/or other information comprises optimizing the mask layout design, for example.

In some embodiments, estimating 1104 the local electric field(s) and/or adjusting 1106 the mask layout design based on the estimated local electric field(s) and/or other information comprises determining an effect of the estimated local electric field(s) and the mask layout design for an etch of the patterning process, and adjusting the mask layout design based on the estimated effect of the mask layout design in combination with the local electric field(s) during the etch. In some embodiments, determining the effect of the estimated local electric field(s) on the mask layout design comprises determining an image charge on conducting components of the mask layout design, solving Poisson's Equation to determine the strength and/or orientation of the local electric field(s) caused by such features, and/or other operations. In some embodiments, method 1100 comprises iteratively repeating the estimating of the local electric field(s) and the adjusting of the mask layout design one or more times to enhance the mask layout design.

In some embodiments, one or more of operations 1102-1106 of method 1100 may comprise outputting an indication of the characteristics of the mask stack region of interest, the mask layout design, the estimated local electric field(s), and/or other information for review by a user. In some embodiments, these operations may include receiving entries and/or selections from the user (e.g., via one or more computer system components described below) that indicate adjustments to the mask stack region of interest, the mask layout design, the estimated local electric field(s), and/or other information desired by the user. Method 1100 may include repeating one or more of operations 1102-1106 to adjust the mask layout design based on updated estimated local electric field(s) generated from the inputs and/or selections made by the user.

As shown in FIG. 11, the adjusting of the mask layout design one or more times to enhance the mask layout design comprises iteratively (e.g., following "no" 1107—conveying a conclusion that a mask layout design is not optimized) determining 1108 an edge placement (e.g., based on overlay and imaging constraints and/or other information), determining 1102 and 1104 the effect of the estimated local electric field(s) and the mask layout design during the etch of the patterning process based on the edge placement, and adjusting 1106 the mask layout design based on the effect estimated based on the edge placement. Responsive to completion of the adjustments to the mask layout design (e.g., following "yes" 1107—conveying a conclusion that a mask layout design is optimized), method 1100 outputs 1110 a local electric field aware mask layout design.

In some embodiments, methods 1050 (FIG. 10) and 1100 (FIG. 11) further comprise adjusting a target feature (e.g., a metrology target design, a mask layout design, and/or other target features) based estimated local electric field(s) to facilitate three-dimensional metrology. For example, a given metrology target may be purposely designed so that it is sensitive to a local electric field. This sensitivity to a local electric field may allow the given metrology target to function as, or as part of, a metrology tool configured to probe a non-planar third (e.g., "z") wafer direction. For example, the effect of a local electric field on an etch can be used as a "probe" to measure the etch depth. The deeper the etch, the more asymmetry is introduced in structure that is being etched. This can be picked up by a color-to-color dependency of a metrology detection system like Yieldstar, for example.

The embodiments may further be described using the following clauses:

1. A method for adjusting a target feature in a model of a patterning process based on local electric fields estimated for the patterning process, the method comprising:

obtaining, with a hardware computer system, a mask stack region of interest, the mask stack region of interest having one or more characteristics associated with propagation of electromagnetic waves through the mask stack region of interest, the mask stack region of interest including the target feature;

estimating, with the hardware computer system, a local electric field based on the one or more characteristics associated with the propagation of electromagnetic waves through the mask stack region of interest, the local electric field estimated for a portion of the mask stack region of interest in proximity to the target feature; and adjusting, by the hardware computer system, the target feature based on the estimated local electric field.

2. The method of clause 1, wherein adjusting the target feature based on the estimated local electric field comprises determining, by the hardware computer system, an effect of the estimated local electric field on the target feature during an etch of the patterning process, and adjusting, by the hardware computer system, the target feature based on the estimated effect on the target feature during the etch.

3. The method of clause 2, wherein determining the effect of the estimated local electric field on the target feature comprises determining, by the hardware computer system, an image charge on conducting components in the portion of the mask stack region of interest in proximity to the target feature and/or solving, by the hardware computer system, Poisson's Equation to determine the local electric field.

4. The method of any of clauses 1-3, wherein the target feature is a metrology target design.

5. The method of clause 4, further comprising iteratively repeating, by the hardware computer system, the estimating of the local electric field and the adjusting of the target feature one or more times to enhance the metrology target design.

6. The method of clause 5, further comprising enhancing, with the hardware computer system, the metrology target design to reduce an estimated difference between an overlay measured after photo resist development (after development inspection—ADI) and an overlay measured after an etch (after etch inspection—AEI) of the patterning process.

7. The method of clause 6, wherein the difference between ADI and AEI is an overlay penalty (ADI—AEI).

8. The method of clause 7, further comprising determining, with the hardware computer system, a correction for an AEI overlay measurement, and/or determining the AEI overlay measurement, based on the enhanced metrology target design.

9. The method of any of clauses 5-8, wherein the adjusting of the target feature one or more times to enhance the metrology target design comprises one or more of adjusting, by the hardware computer system, placement of the metrology target relative to other features in a mask layout design, or adding, by the hardware computer system, one or more dummy features to the metrology target design.

10. The method of any of clauses 1-9, wherein the one or more characteristics associated with propagation of electromagnetic waves through the mask stack region of interest comprise stack characteristics including one or more of layer properties, stack design rules, or layer integration requirements.

11. The method of any of clauses 1-10, wherein the one or more characteristics associated with propagation of electromagnetic waves through the mask stack region of interest comprise metrology target design characteristics including one or more of a top grating design, contrast, or a bottom grating design.

12. The method of any of clauses 1-3, wherein the target feature is a mask layout design.

13. The method of clause 12, further comprising iteratively repeating, by the hardware computer system, the estimating of the local electric field and the adjusting of the target feature one or more times to enhance the mask layout design.

14. The method of clause 13, wherein the adjusting of the target feature one or more times to enhance the mask layout design comprises one or more of adjusting, by the hardware computer system, feature placement in the mask layout design, or adding, by the hardware computer system, one or more dummy features to the mask layout design.

15. The method of clause 14, wherein the adjusting of the target feature one or more times to enhance the mask layout design comprises (1) determining, by the hardware computer system, an edge placement, (2) determining, by the hardware computer system, the effect of the estimated local electric field on the mask layout design during the etch of the patterning process based on the edge placement, and (3) adjusting, by the hardware computer system, the mask layout design based on the effect estimated based on the edge placement.

16. The method of any of clauses 12-15, wherein the one or more characteristics associated with propagation of electromagnetic waves through the mask stack region of interest comprise stack characteristics including one or more of layer properties, stack design rules, or layer integration requirements.

17. The method of any of clauses 12-16, wherein the one or more characteristics associated with propagation of electromagnetic waves through the mask stack region of interest comprise mask layout design characteristics including an arrangement of features relative to each other, proximity of conducting portions of individual layers to each other, or a location of the mask stack region of interest relative to an edge and/or a center of a wafer in the model of the patterning process.

18. The method of any of clauses 1-17, further comprising outputting, by the hardware computer system, and indication of the estimated local electric field and/or the effect of the estimated local electric field on the target feature for review by a user, receiving entries and/or selections, by the hardware computer system, from the user that indicate adjustments to the target feature desired by the user; and adjusting, by the hardware computer system, the target feature based on the estimated local electric field and the desired adjustments.

19. The method of any of clauses 1-18, further comprising adjusting, by the hardware computer system, the target feature based on the estimated local electric field to facilitate three-dimensional metrology.

20. A computer program product comprising a non-transitory computer readable medium having instructions recorded thereon, the instructions when executed by a computer implementing the method of any of clauses 1-19.

21. The method of any clauses 1-20, wherein the propagation of the electromagnetic waves corresponds to illumination used in metrology measurement.

22. The method of any clauses 1-21, wherein the target feature is a metrology target feature.

23. The method of any clauses 1-22, wherein the target feature is an overlay target feature, or an alignment target feature.

Figure 12:
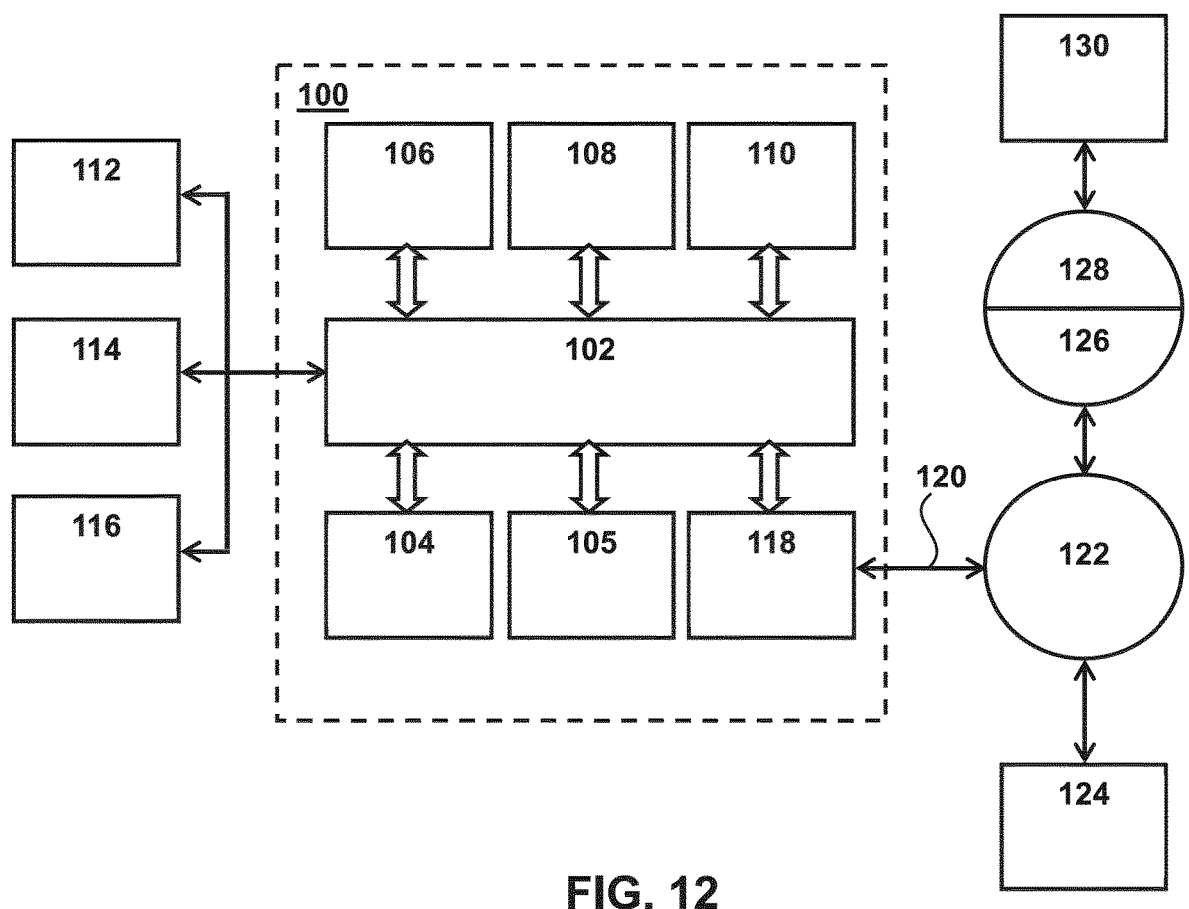
FIG. 12 is a block diagram of an example computer system, according to an embodiment.

FIG. 12 is a block diagram that illustrates a computer system 100 that can assist in implementing the methods, flows or the system(s) disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 13:
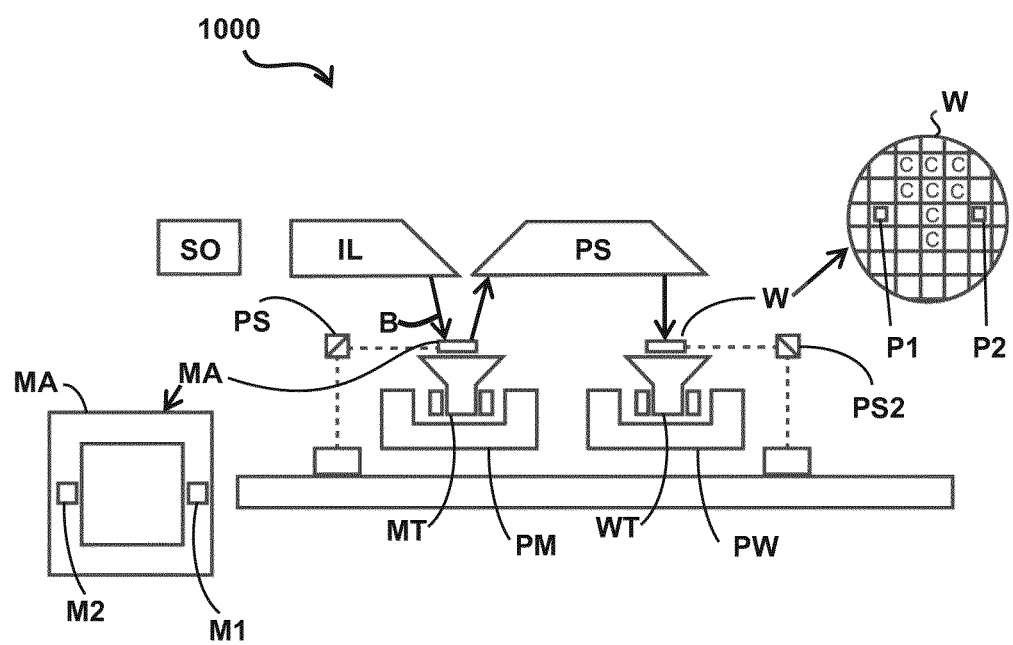
FIG. 13 is a schematic diagram of a lithographic projection apparatus similar to FIG. 1, according to an embodiment.

FIG. 13 schematically depicts an exemplary lithographic projection apparatus in conjunction with the techniques described herein can be utilized. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 13 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT.

Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 14:
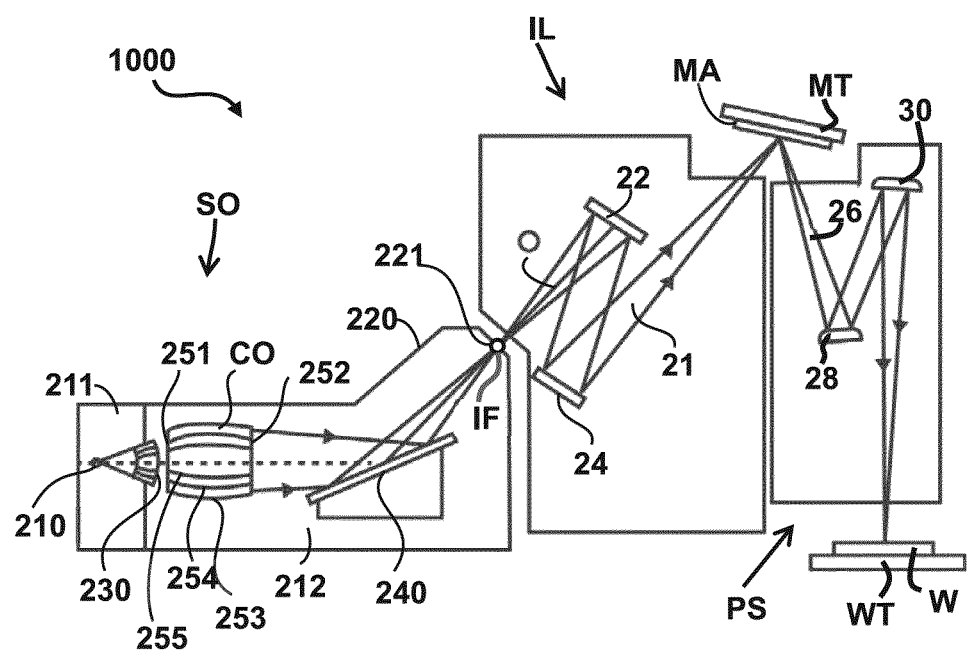
FIG. 14 is a more detailed view of the apparatus in FIG. 13, according to an embodiment.

FIG. 14 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 20.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 15:
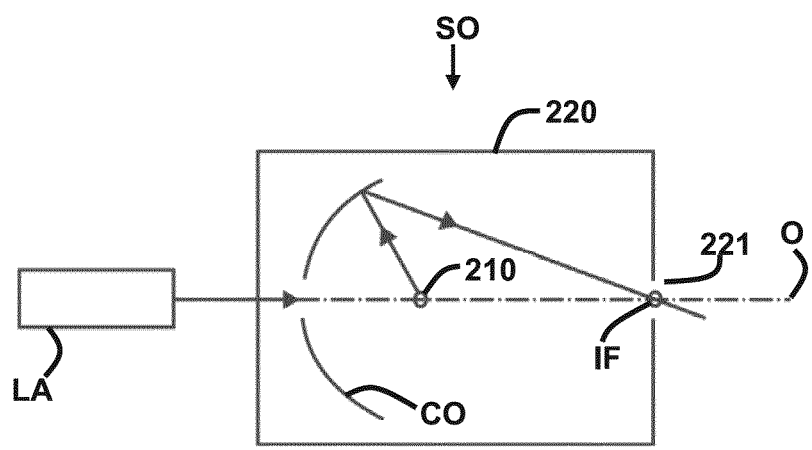
FIG. 15 is a more detailed view of the source collector module SO of the apparatus of FIG. 13 and FIG. 14, according to an embodiment.

Alternatively, the source collector module SO may be part of an LPP radiation system as shown in FIG. 15. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
obtaining a mask stack region of interest for a patterning process, the mask stack region of interest having one or more characteristics associated with propagation of electromagnetic waves through the mask stack region of interest, the mask stack region of interest including a target feature and subject to an etch process after the propagation of electromagnetic waves through the mask stack region of interest;
estimating, by a hardware computer system, a local electric field based on the one or more characteristics associated with the propagation of electromagnetic waves through the mask stack region of interest, the local electric field estimated for a portion of the mask stack region of interest in proximity to the target feature; and
determining, by the hardware computer system, a characteristic of the target feature based on the estimated local electric field.

2. The method of claim 1, wherein the determining the characteristic of the target feature based on the estimated local electric field comprises determining, by the hardware computer system, an effect of the estimated local electric field on the target feature during an etch of the patterning process, and determining, by the hardware computer system, the characteristic of the target feature based on the estimated effect on the target feature during the etch.

3. The method of claim 2, wherein determining the effect of the estimated local electric field on the target feature comprises determining, by the hardware computer system, an image charge on conducting components in the portion of the mask stack region of interest in proximity to the target feature and/or solving, by the hardware computer system, Poisson's Equation to determine the local electric field.

4. The method of claim 1, wherein the target feature is a metrology target design.

5. The method of claim 4, further comprising iteratively repeating, by the hardware computer system, the estimating of the local electric field and the determining the characteristic of the target feature one or more times to enhance the metrology target design, and/or
enhancing, with the hardware computer system, the metrology target design to reduce an estimated difference between an overlay measured after photo resist development (after development inspection—ADI) and an overlay measured after an etch (after etch inspection—AEI) of the patterning process.

6. The method of claim 5, further comprising determining, with the hardware computer system, a correction for an AEI overlay measurement, and/or determining the AEI overlay measurement, based on the enhanced metrology target design.

7. The method of claim 5, wherein the iteratively repeating the estimating and the determining and/or the enhancing, to enhance the metrology target design comprises one or more selected from: adjusting, by the hardware computer system, placement of the metrology target of the metrology target design relative to other features in a mask layout design, or adding, by the hardware computer system, one or more dummy features to the metrology target design.

8. The method of claim 1, wherein the one or more characteristics associated with propagation of electromagnetic waves through the mask stack region of interest comprise one or more stack characteristics including one or more selected from: a layer property, a stack design rule, or a layer integration requirement.

9. The method of claim 1, wherein the one or more characteristics associated with propagation of electromagnetic waves through the mask stack region of interest comprise one or more metrology target design characteristics including one or more selected from: a top grating design, contrast, or a bottom grating design.

10. The method of claim 1, wherein the target feature is a mask layout design.

11. The method of claim 10, further comprising iteratively repeating, by the hardware computer system, the estimating of the local electric field and the adjusting of the target feature one or more times to enhance the mask layout design.

12. The method of claim 10, wherein the one or more characteristics associated with propagation of electromagnetic waves through the mask stack region of interest comprise one or more stack characteristics including one or more selected from: a layer property, a stack design rule, or a layer integration requirement.

13. The method of claim 10, wherein the one or more characteristics associated with propagation of electromagnetic waves through the mask stack region of interest comprise mask layout design characteristics including an arrangement of features relative to each other, proximity of conducting portions of individual layers to each other, or a location of the mask stack region of interest relative to an edge and/or a center of a wafer in a model of the patterning process.

14. The method of claim 1, further comprising outputting, by the hardware computer system, an indication of the estimated local electric field and/or the effect of the estimated local electric field on the target feature for review by a user, receiving one or more entries and/or selections, via the hardware computer system, from the user that indicate one or more adjustments to the target feature desired by the user; and adjusting, by the hardware computer system, the target feature based on the estimated local electric field and the one or more desired adjustments.

15. The method of claim 1, further comprising adjusting, by the hardware computer system, the target feature based on the estimated local electric field to facilitate three-dimensional metrology.

16. A computer program product comprising a non-transitory computer readable medium having instructions therein, the instructions, when executed by a computer system, configured to cause the computer system to at least:
obtain a mask stack region of interest for a patterning process, the mask stack region of interest having one or more characteristics associated with propagation of electromagnetic waves through the mask stack region of interest, the mask stack region of interest including a target feature and subject to an etch process after the propagation of electromagnetic waves through the mask stack region of interest;
estimate a local electric field based on the one or more characteristics associated with the propagation of electromagnetic waves through the mask stack region of interest, the local electric field estimated for a portion of the mask stack region of interest in proximity to the target feature; and
determine a characteristic of the target feature based on the estimated local electric field.

17. The computer program product of claim 16, wherein the instructions configured to cause the computer system to determine the characteristic of the target feature based on the estimated local electric field are further configured to cause the computer system to determine an effect of the estimated local electric field on the target feature during an etch of the patterning process, and determine the characteristic of the target feature based on the estimated effect on the target feature during the etch.

18. The computer program product of claim 17, wherein the instructions configured to cause the computer system to determine the effect of the estimated local electric field on the target feature are further configured to cause the computer system to determine an image charge on conducting components in the portion of the mask stack region of interest in proximity to the target feature and/or solve Poisson's Equation to determine the local electric field.

19. The computer program product of claim 16, wherein the target feature is a metrology target design.

20. The computer program product of claim 16, wherein the instructions are further configured to cause the computer system to:
  iteratively repeat the estimation of the local electric field and determination of the characteristic of the target feature one or more times to enhance the metrology target design, and/or
  enhance the metrology target design to reduce an estimated difference between an overlay measured after photo resist development (after development inspection—ADI) and an overlay measured after an etch (after etch inspection—AEI) of the patterning process.

\* \* \* \* \*